United States Patent
Yang

(10) Patent No.: US 8,804,096 B2
(45) Date of Patent: Aug. 12, 2014

(54) APPARATUS FOR AND METHOD OF WAFER EDGE EXPOSURE

(75) Inventor: Chin Cheng Yang, Kaohsiung County (TW)

(73) Assignee: Macronix International Co., Ltd., Hsin-Chu (TW)

( * ) Notice: Subject to any disclaimer, the term of this patent is extended or adjusted under 35 U.S.C. 154(b) by 715 days.

(21) Appl. No.: 13/091,880

(22) Filed: Apr. 21, 2011

(65) Prior Publication Data

US 2012/0268721 A1    Oct. 25, 2012

(51) Int. Cl.
*G03B 27/42*    (2006.01)
*G03B 27/54*    (2006.01)

(52) U.S. Cl.
USPC .............................................. 355/53; 355/67

(58) Field of Classification Search
CPC .. G03F 7/2022; G03F 7/2028; G03F 7/70466
USPC ................................................ 355/53, 67, 71
See application file for complete search history.

(56) References Cited

U.S. PATENT DOCUMENTS

| 5,204,224 A * | 4/1993 | Suzuki ........................ 430/315 |
| 5,229,811 A * | 7/1993 | Hattori et al. ................... 355/50 |
| 2009/0174873 A1 * | 7/2009 | Kikuchi ......................... 355/53 |

* cited by examiner

*Primary Examiner* — Peter B Kim
(74) *Attorney, Agent, or Firm* — Alston & Bird LLP

(57) ABSTRACT

An apparatus for wafer edge exposure comprises a first exposure unit and a second exposure unit. The first exposure unit includes a first light source to emit first light of multiple wavelengths, and a first mask to direct the first light toward a first area at an edge portion of a wafer. The second exposure unit includes a second light source to emit second light of a single wavelength, and a second mask to direct the second light toward a second area at the edge portion of the wafer. The second area encloses a transition area that borders the first area under the first mask.

22 Claims, 10 Drawing Sheets

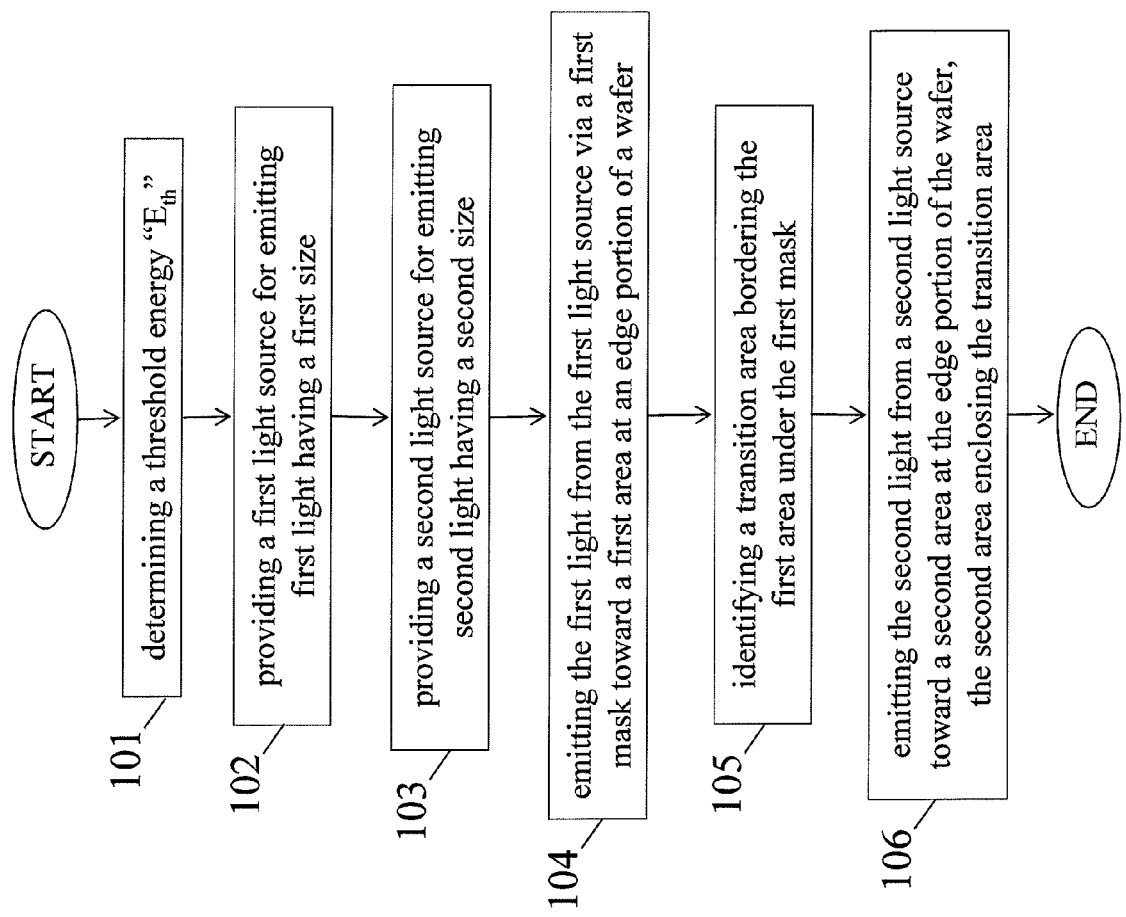

APPARATUS FOR AND METHOD OF WAFER EDGE EXPOSURE

BACKGROUND OF THE INVENTION

The present invention generally relates to wafer edge exposure and, more particularly, to an apparatus for and a method of wafer edge exposure.

In the manufacturing of semiconductor products, a wafer edge exposure (WEE) process may be employed for exposing a photoresist film on an edge portion of a wafer so that undesired photoresist may be removed during a subsequent developing process. Generally, an apparatus for WEE processing may be installed in a tracker and equipped with a single light source.

FIG. 1 is a schematic diagram of an apparatus 70 for wafer edge exposure apparatus in prior art. Referring to FIG. 1, the apparatus 70 may include a light source 71, a reflector 72, a collective lens 73 and a light-shielding mask 74 with a slit 75. During a WEE process, an edge portion $W_E$ of a wafer "W" is exposed to light emitted from the light source 71 via the reflector 72, the collective lens 73 and the slit 75 of the light-shielding mask 74.

Such apparatus with a single light source, however, may not be able to properly expose an undesired photoresist film on a wafer edge in advanced semiconductor manufacturing as device patterns are increasingly reduced in size. For example, the light source may emit light composed of multiple light components of different wavelengths in a relatively large bandwidth, which may result in photoresist pattern deformation or peeling, especially in the manufacturing of downsized semiconductor products. It may therefore be desirable to have an apparatus for and a method of wafer edge exposure.

BRIEF SUMMARY OF THE INVENTION

The present invention is directed to an apparatus for wafer edge exposure and a method of wafer edge exposure that are able to address the issue in the prior art.

Examples of the present invention may provide an apparatus for wafer edge exposure. The apparatus includes a first exposure unit that comprises a first light source to emit first light of multiple wavelengths, and a first mask to direct the first light toward a first area at an edge portion of a wafer, and includes a second exposure unit that comprises a second light source to emit second light of a single wavelength, and a second mask to direct the second light toward a second area at the edge portion of the wafer.

Some examples of the present invention may also provide an apparatus for wafer edge exposure. The apparatus includes a first light source to emit first light toward a first area at an edge portion of a wafer via a first mask, the first light source having a first source size, and includes a second light source to emit second light toward a second area at the edge portion of the wafer via a second mask, the second light source having a second source size smaller than the first source size.

Examples of the present invention may further provide a method of wafer edge exposure. The method includes providing a first exposure unit to expose photoresist on a first area at an edge portion of a wafer, the first exposure unit comprising a first light source to emit first light of multiple wavelengths, and a first mask to direct the first light toward the first area, providing a second exposure unit to expose photoresist on a second area at the edge portion of the wafer, the second exposure unit comprising a second light source to emit second light of a single wavelength, and a second mask to direct the second light toward the second area, emitting the first light from the first light source via the first mask toward the first area, and emitting the second light from the second light source via the second mask toward the second area, wherein the second area encloses a transition area that borders the first area under the first mask Additional features and advantages of the present invention will be set forth in portion in the description which follows, and in portion will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention as claimed.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, examples are shown in the drawings. It should be understood, however, that the invention is not limited to the precise arrangements and instrumentalities shown in the examples.

In the drawings:

FIG. 10 is a flow diagram of a method of wafer edge exposure in accordance with an example of the present invention.

DETAILED DESCRIPTION OF THE INVENTION

Reference will now be made in detail to the present examples of the invention illustrated in the accompanying drawings. Wherever possible, the same reference numbers will be used throughout the drawings to refer to the same or like portions. It should be noted that the drawings are in greatly simplified form and are not to precise scale.

Figure 1:
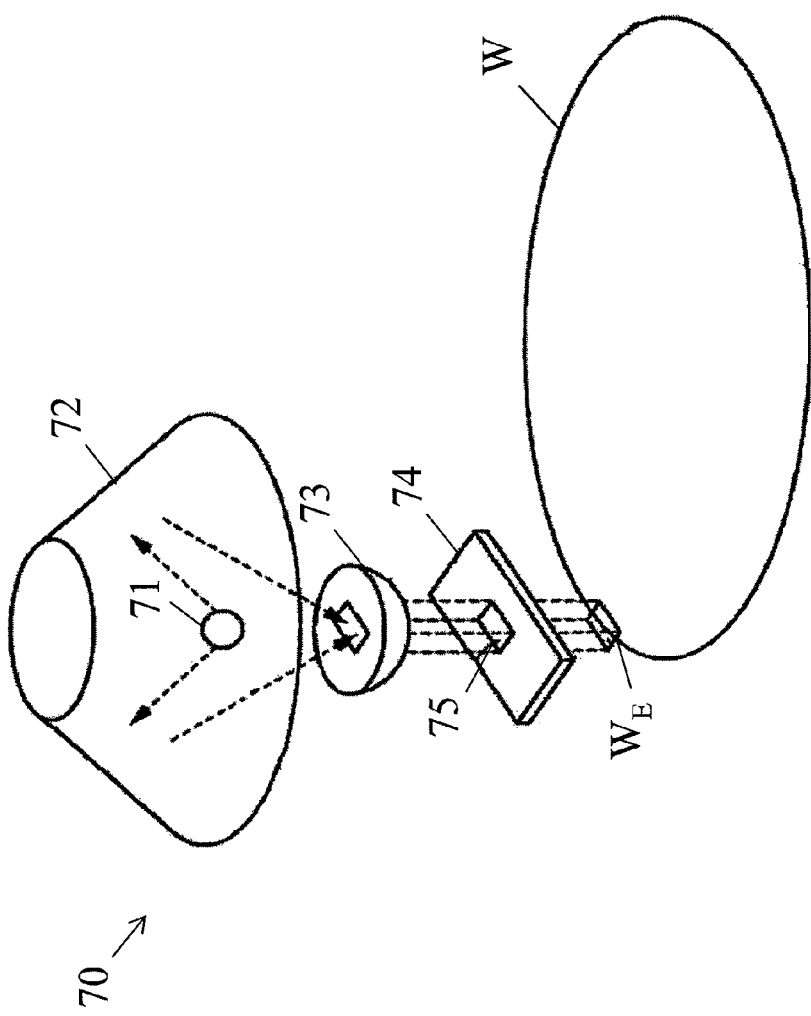
FIG. 1 is a schematic diagram of an apparatus for wafer edge exposure (WEE) in prior art.
Figure 2:
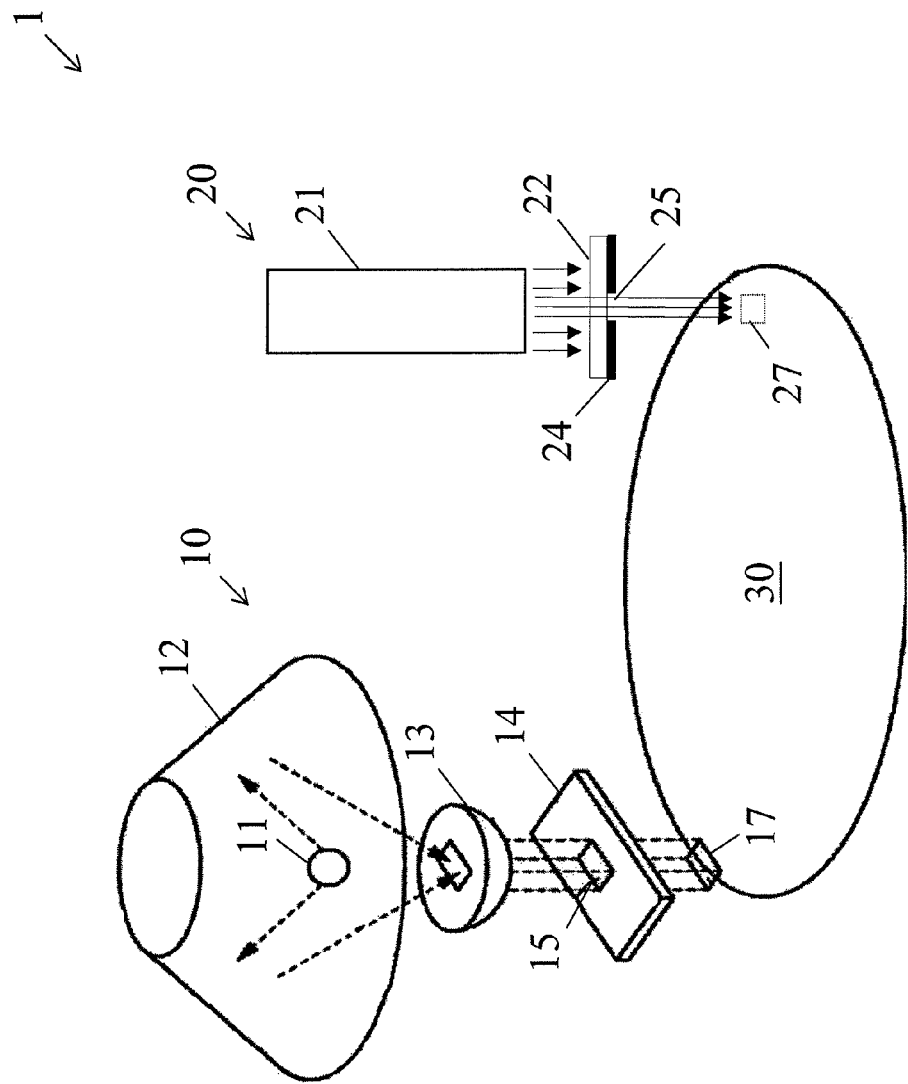
FIG. 2 is a schematic diagram of an apparatus for wafer edge exposure in accordance with an example of the present invention.

FIG. 2 is a schematic diagram of an apparatus 1 for wafer edge exposure (WEE) in accordance with an example of the present invention. To expose a wafer, the apparatus 1 may work in conjunction with a photolithography apparatus. However, for simplicity, only the apparatus 1 for wafer edge exposure is illustrated and the photolithography apparatus or other is omitted.

Referring to FIG. 2, the apparatus 1 may include a first exposure unit 10 and a second exposure unit 20. The first exposure unit 10 may further include a first light source 11, a reflector 12, a collective lens 13 and a first mask 14 with a first opening 15 for performing a first WEE process. The second exposure unit 20 may further include a second light source 21, a support 22 and a second mask 24 with a second opening 25 for performing a second WEE process. The first and second WEE processes are performed to expose undesired photoresist at an edge portion of a wafer 30, which may be held by a rotatable plate (not shown). Moreover, as first light from the first light source 11 passes through the first mask 14, the first opening 15 may shape a first process window 17 on the edge portion of the wafer 30. Furthermore, as second light from the second light source 21 passes through the second mask 24, the second opening 25 may shape a second process window 27 on the edge portion of the wafer 30.

Figure 3:
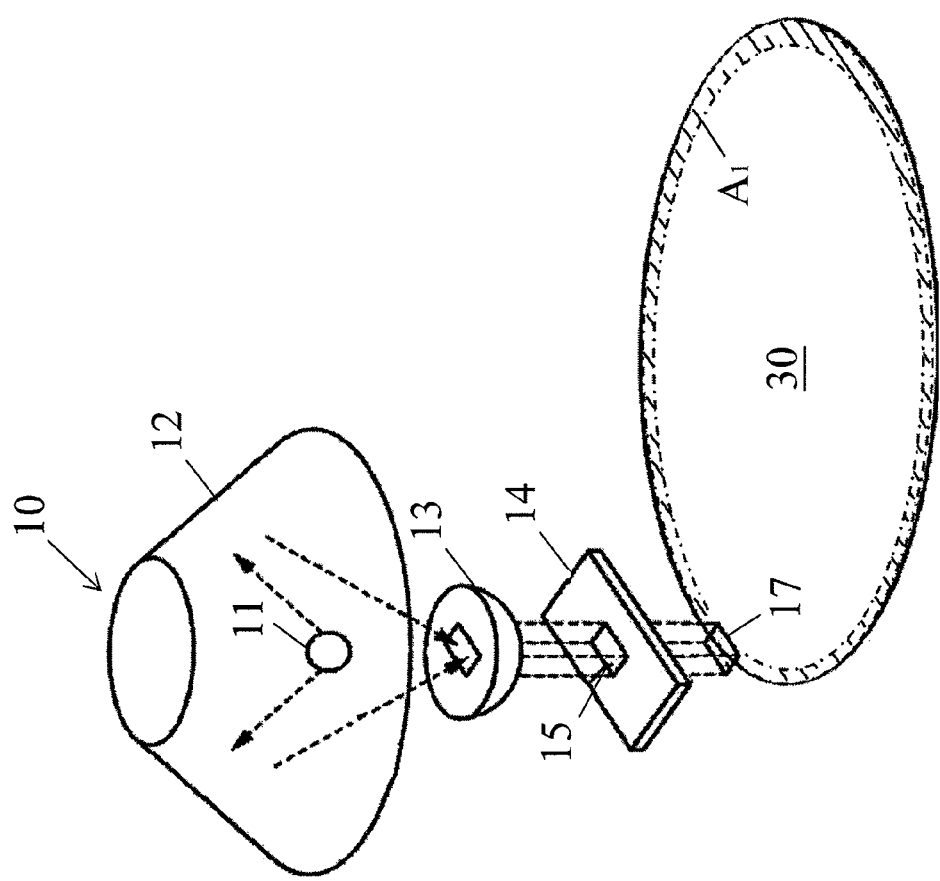
FIG. 3 is a schematic diagram of a first exposure unit of the apparatus illustrated in FIG. 2.

FIG. 3 is a schematic diagram of the first exposure unit 10 of the apparatus 1 illustrated in FIG. 2. Referring to FIG. 3, the first light emitted from the first light source 11 may be reflected by the reflector 12 toward the first mask 14 via the collective lens 13. The reflector 12 may be shaped to facilitate the convergence of the first light at the collective lens 13. The collective lens 13 focuses the reflected first light at the first opening 15 of the first mask 14. As the wafer 30 is rotated with respect to the first exposure unit 10, a first area $A_1$ at the edge portion of the wafer 30 may be completely exposed by the first light through the first process window 17. The cut width of the first area $A_1$ may, for example, range from approximately 0.3 millimeter (mm) to 5 mm, which depends on the requirements of the process.

The first light source 11 may include a lamp such as a xenon-mercury (Xe—Hg) lamp, wherein the size of the first light source 11 may range from approximately 5 mm to 50 mm. Furthermore, the first light from the first light source 11 may be composed of optical waves of different wavelengths in a first bandwidth. However, due to the size and different wavelengths of first light source 11, the light cannot be well reflected to focus on the collective lens 13, and the image contrast of the light from the lens collective 13 is thus relatively low. That is, the light from the first light source 11 is not parallel or coherent light. Moreover, the thickness of the first mask 14 may be in the range of 0.1 mm to 3 mm, which may be too thick for the light with multiple wave lengths, for instance, the light with a bandwidth from 190 nanometer (nm) to 450 nm. Then, the light with low image contrast passes through the first opening 15, forming the first process window 17 on wafer edge. In one example, the size of the first process window 17 may be about 3 mm×3 mm. However, a shielding mask shadow effect may occur as the light with poor image contrast passes through a thick mask.

The second light source 21 may include or emulate a point light source that is configured to emit coherent light in a second bandwidth or emit a light wave more coherent than the first light. Accordingly, the first light may have a light source size greater than the second light source size. In one example according to the present invention, the first light may have a first light source size ranging from approximately 5 mm to 50 mm, and the second light may have a second light source size ranging from approximately 10 micrometer (um) to 1000 um. Moreover, the second bandwidth may be much smaller than the first bandwidth. Depending on the property of photoresist, the second light source 21 in one example may include an argon fluoride (ArF) laser that emits the second light of a single wavelength of approximately 193 nm. In another example, the second light source 21 may include a krypton fluoride (KrF) laser that emits the second light of a single wavelength of approximately 248 nm.

Figure 4:
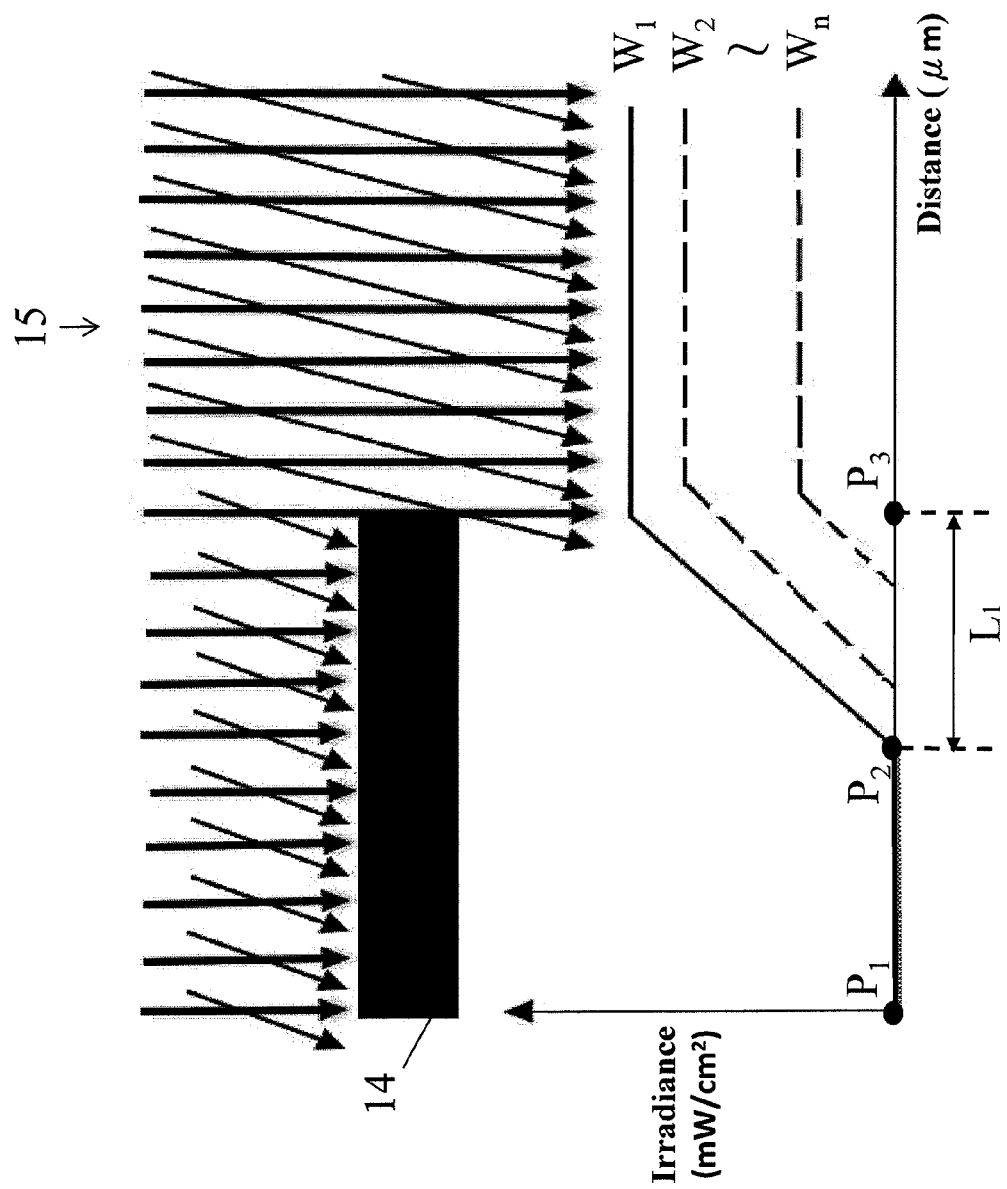
FIG. 4 is a diagram showing the energy distribution at an edge portion of a wafer after a first WEE process.

FIG. 4 is a diagram showing the energy distribution at an edge portion of the wafer 30 after the first WEE process. It may be assumed that the first light from the first light source 11 is composed of optical waves $W_1$ to $W_N$, each of which has a different wavelength, N being a natural number greater than 1. Referring to FIG. 4, the X-axis represents the distance (in micrometer, μm) between a point $P_1$ and an edge of the wafer 30, and the Y-axis represents the amount of irradiance (in milliwatts per square centimeter, mW/cm$^2$) of the waves $W_1$ to $W_N$ of the first light applied to the edge portion. It may be further assumed that $W_1$ has the shortest wavelength while $W_N$ has the longest wavelength and thus the waves $W_1$ and $W_N$ have the largest and smallest optical energy, respectively, among the waves $W_1$ to $W_N$. In one example, the first bandwidth may range between approximately 190 and 450 nanometers (nm), which may cover the visible light spectrum.

Due to the factors of large light source, multiple waves and thick mask, when the first light passes through the first opening 15, the shielding mask shadow effect may occur, resulting in a transition area under the first mask 14 about the first opening 15. The different wavelengths $W_1$ to $W_N$ of the first light may cause different transition sub-areas (shown in dashed lines). In the present example, the transition area has a first width $L_1$ from points $P_2$ to $P_3$ along a radial direction of the wafer 30. In one example, the first width $L_1$ may range from, for example, approximately 10 μm to 50 μm. At the transition area, the amount of optical energy received is smaller than that of a threshold energy $E_{th}$ that is required to completely expose photoresist in order to completely remove the photoresist in a developing process. In one example, the threshold energy $E_{th}$ may range from approximately 10 to 50 millijoules per square centimeter (mj/cm$^2$). As a result, photoresist on the transition area may be incompletely exposed after the first WEE process. The underexposed photoresist, if exists, may adversely affect the subsequent processing and in turn the yield rate.

Figure 5:
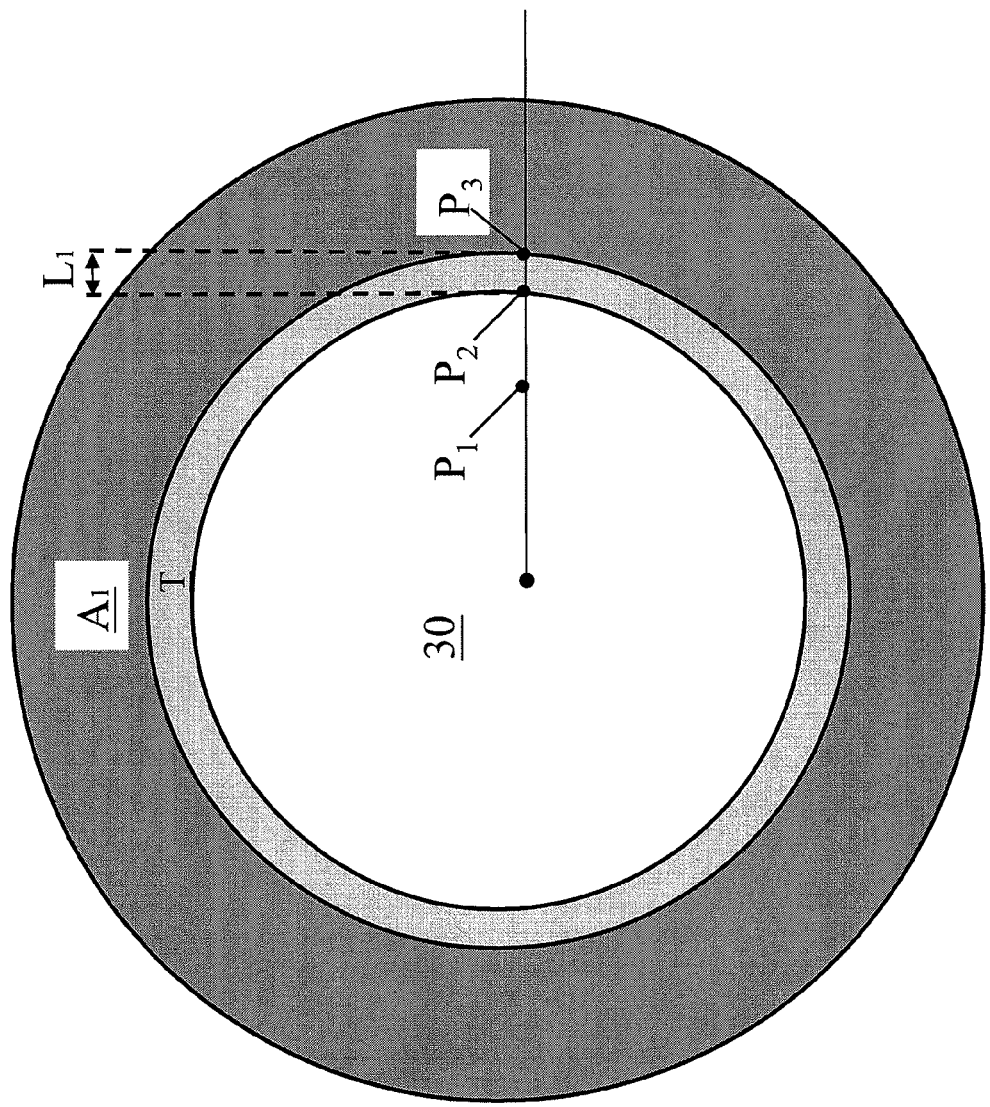
FIG. 5 is a diagram showing a first area and a transition area of a wafer.

FIG. 5 is a diagram showing the first area $A_1$ and a transition area "T" of the wafer 30. Referring to FIG. 5, photoresist on the first area $A_1$ is exposed by the first light during the first WEE process. However, as previously mentioned, photoresist on the transition area T, in the form of an annular region defined between the points $P_2$ and $P_3$ under the first mask 14, may exist due to incomplete exposure. The underexposed photoresist on the transition area T may be liable to peel off or deform, which may not be acceptable in advanced semiconducting manufacturing processes.

Figure 6:
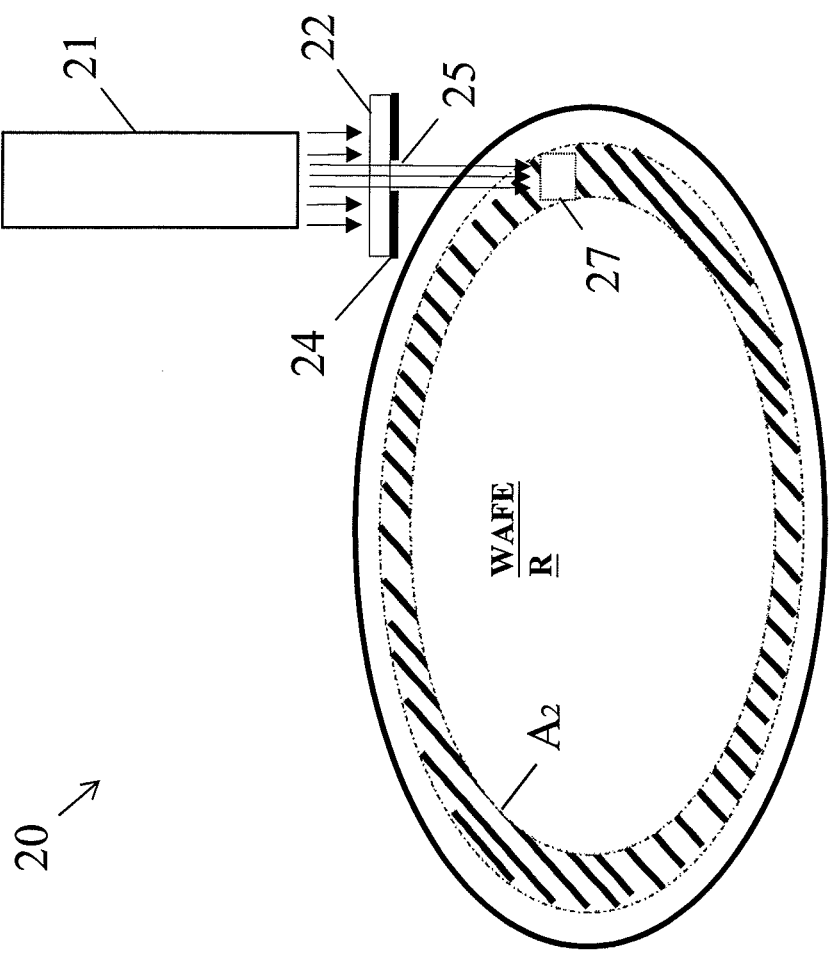
FIG. 6 is a schematic diagram of a second exposure unit of the apparatus illustrated in FIG. 2.

FIG. 6 is a schematic diagram of the second exposure unit 20 of the apparatus 1 illustrated in FIG. 2. Referring to FIG. 6, the second light source 21 may emit the second light toward the edge portion of the wafer 30 via the second mask 24 and the second opening 25. The second light is substantially a parallel or coherent light. The width of the second opening 25 ranges from approximately 10 um to 100 um. The second mask 24 may include a metal film, which is formed on the support 22. The support 22 may be made of a material transparent to the second light. In one example, the support 22 may include but is not limited to a quartz glass. Furthermore, the second mask 24 may include a metal layer of chrome. The thickness of the second mask 24 may be approximately 30 nm to 100 nm, which is much thinner than that of the first mask 14 so as to alleviate the shielding mask shadow effect.

As the wafer 30 is rotated with respect to the second exposure unit 20, a second area $A_2$ at the edge portion of the wafer 30 may be completely exposed by the second light through the second process window 17.

Figure 7:
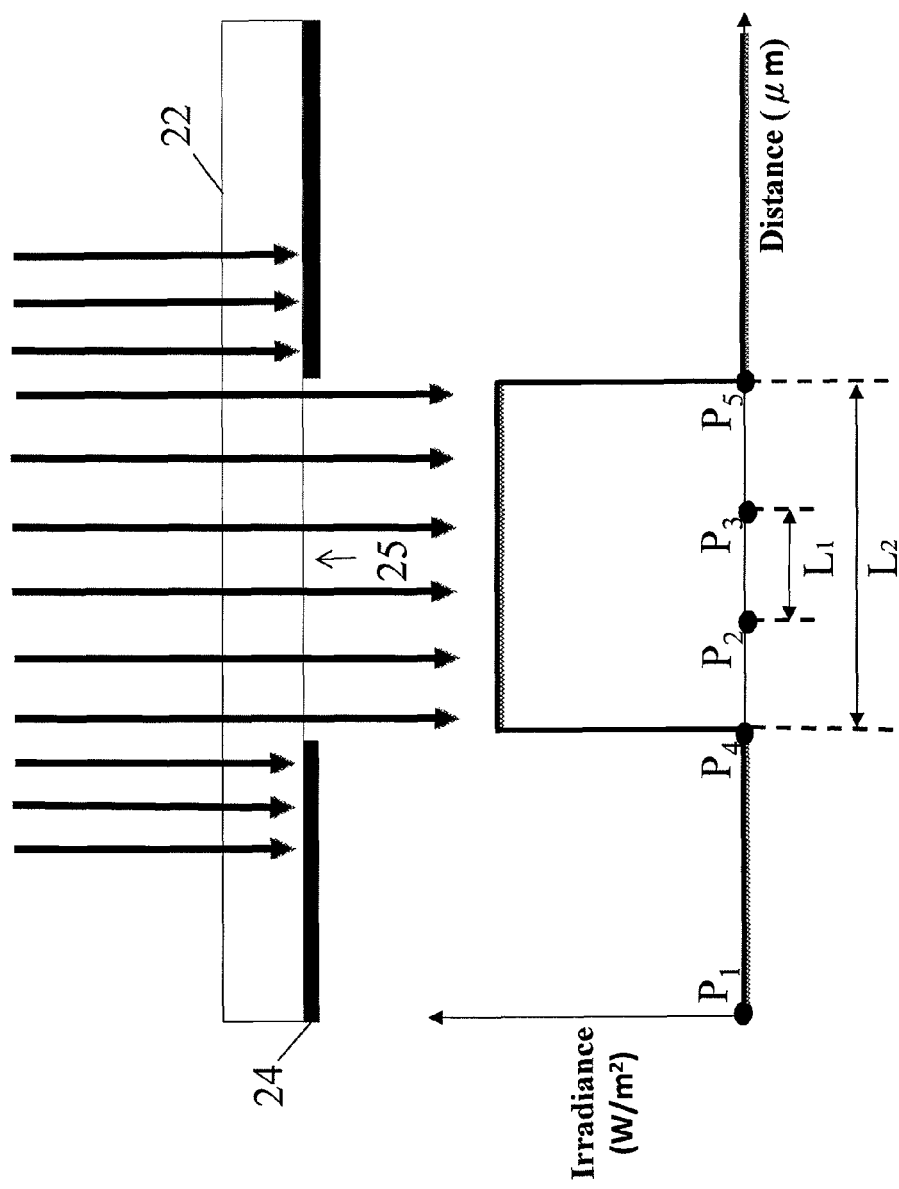
FIG. 7 is a diagram showing the energy distribution at an edge portion of a wafer after a second WEE process.

FIG. 7 is a diagram showing the energy distribution at the edge portion of the wafer 30 after the second WEE process. Referring to FIG. 7, the X-axis represents the distance between the point $P_1$ and an edge of the wafer 30, and the Y-axis represents the amount of irradiance of the second light applied to the edge portion of the wafer 30. Since the second light from the second source 21 exhibits a relatively high optical image contrast, the shielding mask shadow effect may be insignificant. The second opening 25 has a second width $L_2$ equal to the distance between points $P_4$ and $P_5$ along a radial direction of the wafer 30. Furthermore, the second opening 25 is large enough to cover the transition area T in the radial direction so that underexposed photoresist, if any, on the transition area T may be removed. Accordingly, the second width $L_2$ is equal to or greater than the first width $L_1$ of the transition area T in the radial direction. That is, in the case that the second width $L_2$ is equal to the first width $L_1$ of the transition area T in the radial direction, the second area $A_2$ may be the same as the transition area T and the edge portion of the wafer 30 to be exposed may include the first area $A_1$ and the transition area T. Moreover, in the case that the second width $L_2$ is greater than the first width $L_1$ of the transition area T in the radial direction, the second area $A_2$ may enclose the transition area T and overlap the first area $A_1$, and the edge portion of the wafer 30 to be exposed may include the first area $A_1$ and the second area $A_2$ that encloses the transition area T.

Figure 8:
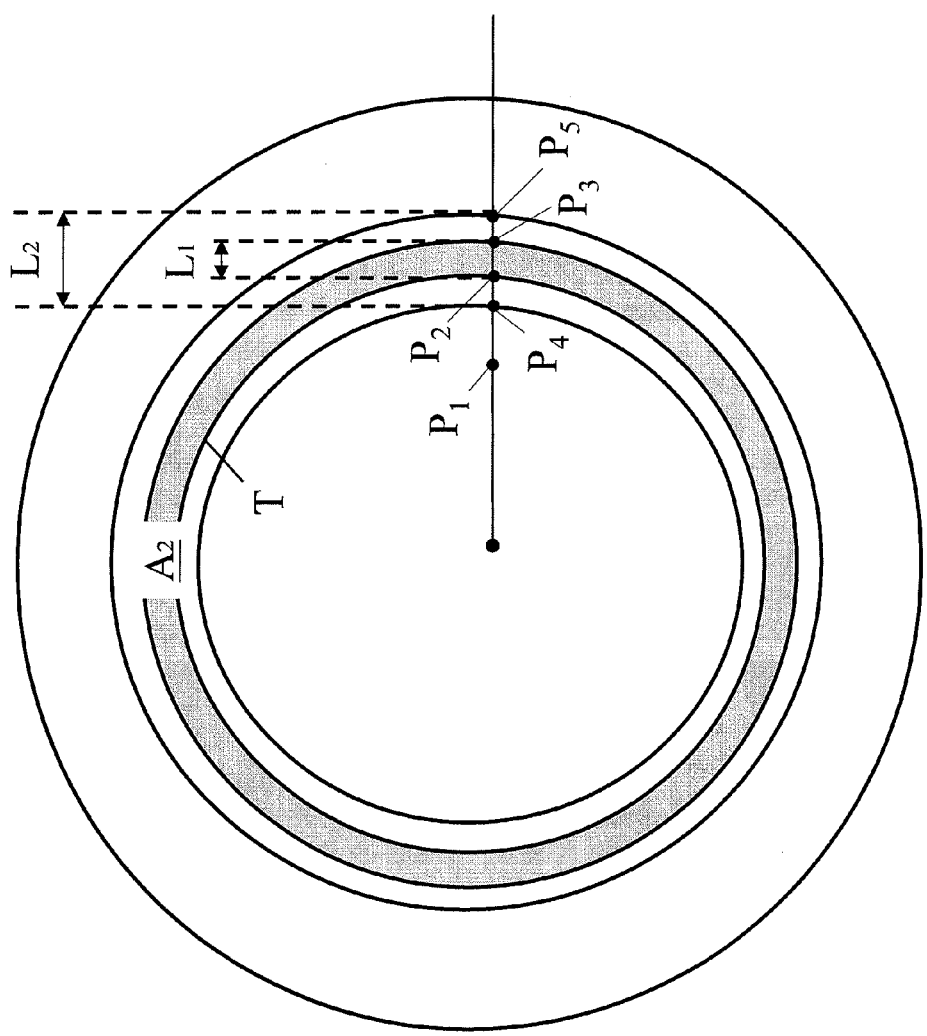
FIG. 8 is a diagram showing a second area of the wafer illustrated in FIG. 5.

FIG. 8 is a diagram showing the second area $A_2$ of the wafer 30 illustrated in FIG. 5. Referring to FIG. 8, photoresist on the second area $A_2$ is exposed to the second light, of which the amount of energy is equal to or greater than the threshold energy $E_{th}$ and thus is sufficient to completely remove photoresist.

In one example according to the present invention, photoresist on an edge portion of a wafer may be processed by the first exposure unit 10 and then the second exposure unit 20 so that residual photoresist on the transition area T, if any, after the first WEE process may be removed by the second exposure unit 20 during the second WEE process. In another example, however, photoresist on an edge portion of a wafer may be processed by the second exposure unit 10 and then the first exposure unit 20. In that case, since the second light is enough to completely expose the photoresist on the edge portion in the second process window 27, no underexposed photoresist is supposed to exist after the second WEE process. The first WEE process performed by the first exposure unit 10 afterwards may nevertheless ensure complete exposure of the photoresist if unexpectedly exists.

Figure 9:
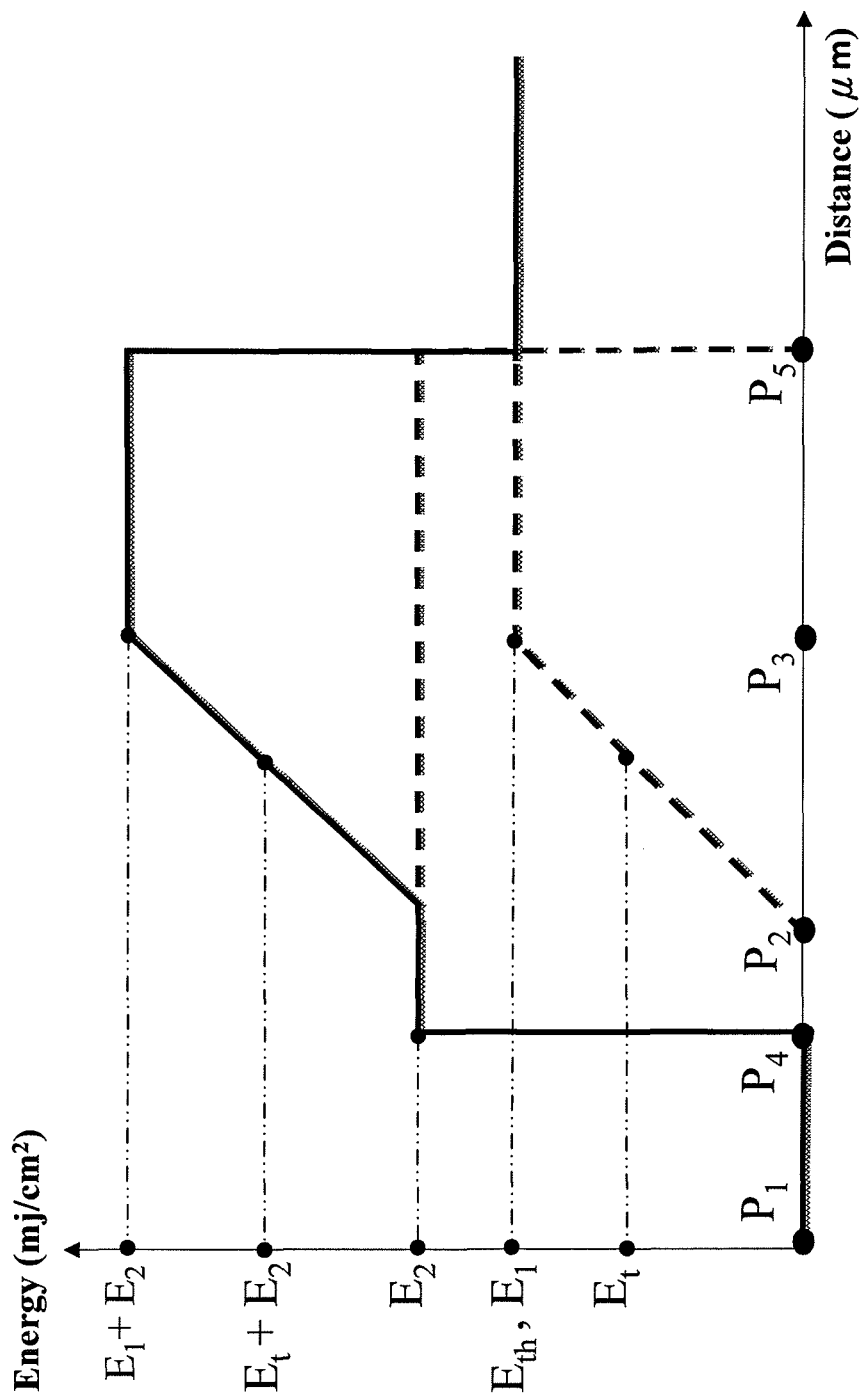
FIG. 9 is a diagram showing the energy distribution at an edge portion of a wafer after a first WEE process and a second WEE process.

FIG. 9 is a diagram showing the energy distribution at the edge portion of the wafer 30 after the first and second WEE processes. Referring to FIG. 9, the amount of energy $E_1$ the first light applied to the first area $A_1$ is equal to the threshold energy $E_{th}$ and thus is sufficient to expose the first area $A_1$. Moreover, as previously discussed, the amount of energy $B_2$ the second light applied to the second area $A_2$ is equal to or greater than the threshold energy $E_{th}$ and thus is sufficient to expose the second area $A_2$. However, the amount of energy $E_t$ received at the transition area T is only a portion of $E_1$, which is not sufficient to completely expose photoresist on the transition area T bordering the first area $A_1$ under the first mask 14. By emitting the second light toward the second area $A_2$ that encloses the transition area T, the amount of energy in total becomes $E_2$ plus $E_t$ at the transition area T, which is greater than the threshold energy $E_{th}$ and thus is sufficient to completely expose the underexposed photoresist.

FIG. 10 is a flow diagram of a method of wafer edge exposure in accordance with an example of the present invention. Referring to FIG. 10, at step 101, a threshold energy level "$E_{th}$" that is able to completely expose photoresist on an edge portion of a wafer may be determined. Furthermore, exposure time may also be determined.

At step 102, a first light source to emit first light of multiple wavelengths may be provided. The first light has a first light source size.

At step 103, a second light source to emit second light of a single wavelength may be provided. The second light has a second light source size smaller than the first light source size.

At step 104, the first light may be emitted from the first light source via a first mask toward a first area at the edge portion of the wafer. The energy level of the first light applied over the exposure time is equal to or greater than the threshold energy level so as to completely expose photoresist on the first area. The first area may take an annular shape and cover the wafer edge.

Due to low optical image contrast and mask shielding effect of the first unit 10, when applying the first energy to the first area, a transition area bordering the first area under the first mask may receive a portion of the first light and in turn a portion of the first energy. However, such received energy is not sufficient to completely expose photoresist on the transition area. At step 105, the transition area where underexposed photoresist may exist is identified.

At step 106, the second light may be emitted from the second light source via a second mask toward a second area at the edge portion of the wafer. The second area is located more proximal to the wafer center than the first area and encloses the transition area. Furthermore, the energy level of the second light applied over the exposure time is equal to or greater than the threshold energy level so as to completely expose photoresist on the second area, including underexposed photoresist, if any, on the first area.

In the present example, the edge portion is scanned by the first light source followed by the second light source. In another example, the second light source may scan the edge portion first. In that case, the transition area associated with the first light may be identified. Next, the second light may be emitted from the second light source toward the second area enclosing the transition area. Subsequently, the first light may be emitted from the first light source to scan the first area, which is located more distal to the wafer center than the second area.

It will be appreciated by those skilled in the art that changes could be made to the examples described above without departing from the broad inventive concept thereof. It is understood, therefore, that this invention is not limited to the particular examples disclosed, but it is intended to cover modifications within the spirit and scope of the present invention as defined by the appended claims.

Further, in describing representative examples of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

I claim:

1. An apparatus for wafer edge exposure comprising:
   a first exposure unit comprising:
      a first light source to emit first light of multiple wavelengths; and
      a first mask to direct the first light toward a first area at an edge portion of a wafer; and
   a second exposure unit comprising:
      a second light source to emit second light of a single wavelength; and
      a second mask to direct the second light toward a second area at the edge portion of the wafer.

2. The apparatus of claim 1, wherein the first exposure unit further comprises:
   a reflector to reflect the first light from the first light source; and
   a collective lens to converge the first light from the reflector toward the first mask.

3. The apparatus of claim 1, wherein the first light has a first size, and the second light has a second size smaller than the first size.

4. The apparatus of claim 1, wherein the first light has a first size greater than 5 millimeter (mm), and the second light has a second size smaller than 5 mm.

5. The apparatus of claim 1, wherein the second mask of the second exposure unit includes a support and a metal film on the support.

6. The apparatus of claim 1, wherein the second light source includes one of an argon fluoride (ArF) laser and a krypton fluoride (KrF) laser.

7. The apparatus of claim 1, wherein the second area is located more proximal to the center of the wafer than the first area and overlaps the first area.

8. The apparatus of claim 1, wherein the second area encloses a transition area that borders the first area under the first mask.

9. The apparatus of claim 8, wherein the second area is located more proximal to the center of the wafer than the first area and is identical to the transition area.

10. An apparatus for wafer edge exposure comprising:
    a first light source to emit first light toward a first area at an edge portion of a wafer via a first mask, the first light having a first source size; and
    a second light source to emit second light toward a second area at the edge portion of the wafer via a second mask, the second light having a second source size smaller than the first source size.

11. The apparatus of claim 10 further comprising:
    a reflector to reflect the first light from the first light source; and
    a collective lens to converge the first light from the reflector toward the first mask.

12. The apparatus of claim 10, wherein the first light has multiple wavelengths, and the second light has a single wavelength.

13. The apparatus of claim 10, wherein the first size is greater than 5 mm, and the second size is smaller than 5 mm.

14. The apparatus of claim 10, wherein the second mask includes a support and a metal film on the support.

15. The apparatus of claim 10, wherein the second light source includes one of an argon fluoride (ArF) laser and a krypton fluoride (KrF) laser.

16. The apparatus of claim 10, wherein the second area is located more proximal to the center of the wafer than the first area and overlaps the first area.

17. The apparatus of claim 10, wherein the second area encloses a transition area that borders the first area under the first mask.

18. The apparatus of claim 17, wherein the second area is located more proximal to the center of the wafer than the first area and is identical to the transition area.

19. A method of wafer edge exposure comprising:
    providing a first exposure unit to expose photoresist on a first area at an edge portion of a wafer, the first exposure unit comprising:
       a first light source to emit first light of multiple wavelengths; and
       a first mask to direct the first light toward the first area;
    providing a second exposure unit to expose photoresist on a second area at the edge portion of the wafer, the second exposure unit comprising:
       a second light source to emit second light of a single wavelength; and
       a second mask to direct the second light toward the second area;
    emitting the first light from the first light source via the first mask toward the first area; and
    emitting the second light from the second light source via the second mask toward the second area,
    wherein the second area encloses a transition area that borders the first area under the first mask.

20. The method of claim 19 further comprising:
    reflecting the first light from the first light source toward a collective lens; and
    converging the first light from the reflector toward the first mask.

21. The method of claim 19, wherein the first light has a first size greater than 5 mm, and the second light has a second size smaller than 5 mm.

22. The method of claim 19, wherein the second light source includes one of an argon fluoride (ArF) laser and a krypton fluoride (KrF) laser.

* * * * *